United States Patent [19]

Tan

[11] Patent Number: 4,618,510

[45] Date of Patent: Oct. 21, 1986

[54] PRE-PASSIVATED SUB-MICROMETER GATE ELECTRODES FOR MESFET DEVICES

[75] Inventor: Tun S. Tan, Santa Rosa, Calif.

[73] Assignee: Hewlett Packard Company, Palo Alto, Calif.

[21] Appl. No.: 634,250

[22] Filed: Sep. 5, 1984

[51] Int. Cl.[4] .......................................... H01L 21/285
[52] U.S. Cl. ........................................ 427/89; 29/571;
29/591; 156/643; 156/659.1; 427/84; 427/91;
430/314
[58] Field of Search ..................... 427/88, 91, 89, 84;
29/571, 591; 430/314; 156/643, 659.1

[56] References Cited

U.S. PATENT DOCUMENTS 3,920,861 11/1975 Dean ...................................... 427/89
4,519,127 5/1985 Arai ....................................... 29/571
4,525,919 7/1985 Fabian .................................... 427/91

FOREIGN PATENT DOCUMENTS 58-190070 11/1983 Japan ..................................... 29/571

*Primary Examiner*—John D. Smith
*Attorney, Agent, or Firm*—Cheryl L. Shavers; Karl E. Bring; Patrick J. Barrett

[57] ABSTRACT

A method of fabricating sub-micrometer gates in a semiconductor device is disclosed in which a pre-passivation layer is formed over the gate region during fabrication. This pre-passivation layer protects the gate and underlying gate trough region from surface contamination during device fabrication. Sub-micrometer gate lengths are obtained by use of optical lithography, e.g., angle-shadow metal evaporation techniques and chemical lift-off methods.

8 Claims, 16 Drawing Figures

PRE-PASSIVATED SUB-MICROMETER GATE ELECTRODES FOR MESFET DEVICES

BACKGROUND OF THE INVENTION

This invention relates to a method of fabrication of a metal-semiconductor field effect transistor and a structure for such a transistor; and it relates in particular to the method of forming the gate electrode for such transistors.

Fabrication of a metal semiconductor field effect transistor (MESFET, or more commonly, a FET) involves forming drain, source, and gate electrodes on the surface of a semiconductor wafer. Ohmic contacts are generally used for the drain and source electrodes whereas a Schottky barrier metal alloy or system is used for the gate electrode.

Presently, techniques are used in fabricating gate electrodes in an attempt to achieve short gate lengths, low electrical resistance along the width of the gate, and the option to pre-etch the semiconductor wafer before gate metallization is done.

A technique which is currently used in fabricating gate electrodes involves depositing a photoresist layer on a semiconductor wafer surface and then forming an opening in the photoresist layer, thereby exposing the underlying wafer surface. A metal layer is deposited by angle evaporation techniques over the wafer surface and is then removed in selected regions, leaving only the gate electrode. Here gate lengths which are shorter than the photoresist opening can be obtained and the semiconductor wafer can be etched in the gate area before metal deposition to create a gate trough region. However, excessively large gate trough regions are created, and contamination is introduced during processing in this region, resulting in degradation of device transconductance and gain. This technique is described in an article entitled "Sub-micrometer MESFETS Fabricated on Various GaAs Substrates" by C. Li, P. T. Chen, and P. H. Wang published in The Institute of Physics Conference, Ser. No. 45: Chapter 4, 1979. In the method described in the foregoing article, a dielectric layer used for passivation purposes is formed over the structure after gate electrode formation and the electrical resistance of the resulting gate electrode structure is undesirably high (i.e. greater than 12 ohm per 100 micrometer gate width). In fact, because the dielectric layer is formed over the structure after the gate electrode formed, protection of the sensitive gate area during subsequent processing is not done at all.

Another gate fabrication technique which offers low electrical resistance of the gate electrode involves depositing a first photoresist layer on top of a semiconductor material and then forming openings in the first photoresist layer, corresponding to the gate electrode. In one embodiment, when drain and source electrodes have been previously formed, additional openings in the first layer of the photoresist are formed that approximately overlay the drain and source electrodes. A first metal layer is deposited on top of this structure. A second photoresist layer is then deposited on top of the first metal layer; large openings are formed in the second photoresist layer which overlay the openings in the first layer of photoresist. The thickness of the gate electrode, and in one embodiment, the sections overlaying the drain and source electrodes, is then increased by plating gold into the openings in the second layer of photoresist. This technique is disclosed in a U.S. Pat. No. 4,213,840 by Masahiro Omori, James N. Wholey, and J. Ross Anderson, entitled "Low-Resistance, Fine-line Semiconductor Device And The Method For Its Manufacture" issued July 22, 1980. Using this technique it is difficult for one to achieve sub-micron lines with optical lithography methods. In fact, this technique does not solve the contamination problems introduced during subsequent processing but further introduces process controllability and repeatability problems.

SUMMARY OF THE INVENTION

The above and other disadvantages of prior art gate fabrication techniques for microwave FETs are overcome by the structure and method described herein. In accordance with the preferred embodiment, a dielectric (pre-passivation) layer is deposited on a semiconductor wafer surface. Portions of the dielectric layer are removed and ohmic contacts are formed on the exposed semiconductor wafer surface. The dielectric layer in the region between the ohmic contacts as well as the ohmic contacts are coated with a first photoresist layer. A region of the first photoresist layer between the ohmic contacts is removed, thereby exposing a portion of the dielectric layer, to form a base area for the gate electrode. A first metal layer is deposited using angle evaporation on top of the remaining first photoresist layer and a selected portion of the exposed portion of the dieletric layer, to define a gate length region in the base area. Here angle evaporation techniques are used to mask the gate length region in preparation for gate electrode formation. The dielectric layer is removed in the defined gate length region to create an opening, thereby exposing the underlying semiconductor wafer surface, and then the first metal and first photoresist layers are removed. A second photoresist layer is deposited on top of the dielectric layer and larger openings which overlay the first opening in the dielectric layer are then formed in the second photoresist layer. A gate trough region is formed in the exposed semiconductor wafer in the gate length region and a second metal layer is deposited on a portion of the gate trough region. The second metal layer extends through the opening in the dielectric layer in the gate length region and overhangs a portion of the dielectric layer. The configuration of the gate electrode as viewed in a cross-section taken in a plane which is perpendicular to the plane of the wafer surface and the longest dimension of the electrode, forms a "T", or in an alternative embodiment an inverted "L" shape. The second photoresist layer is thereafter removed. The dielectric layer in the region between the ohmic contacts serves as a pre-passivation layer for for an area on the semiconductor wafer surface in which the gate electrode is to be formed. The pre-passivation protects the gate electrode area during subsequent processing from contamination problems introduced during processing; unlike the methods of the prior art in which protection of the sensitive gate electrode area during processing is not done at all. As a result of this pre-passivation prior to gate electrode formation, significant reduction in the gate length and improvements of transconductance, gate resistance and gain of MESFET devices are achieved using this method.

DETAILED DESCRIPTION OF THE PREFERRED EMBODIMENT

Figure 1:
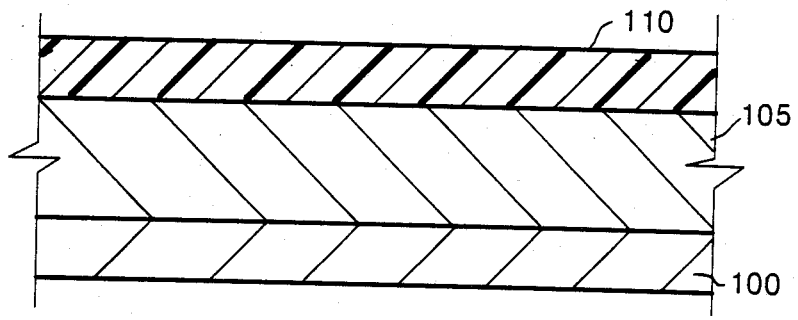
FIG. 1 shows a cross-sectional view of a pre-passivated GaAs wafer according to the preferred embodiment.

FIGS. 1-10 illustrate the preparation of a semiconductor wafer 100, such as gallium arsenide (GaAs) for formation of a gate electrode. As shown in FIG. 1, an epitaxial layer 105, typically made of gallium arsenide having a thickness of about 3000 Angstroms, is formed on GaAs wafer 100 by conventional methods. A dielectric layer 110, typically made of silicon dioxide having a thickness in the range of 2000 to 4000 Angstroms, is then formed on epitaxial layer 105 by conventional methods, such as chemical vapor deposition (CVD). Dielectic layer 110 serves as a pre-passivation layer for an area of the GaAs wafer in which the gate electrode is to be formed. The pre-passivation protects the gate electrode area during subsequent processing. Other materials, such as silicon nitride or polyimide or a combination thereof can be used for dielectric layer 110.

Figure 2:
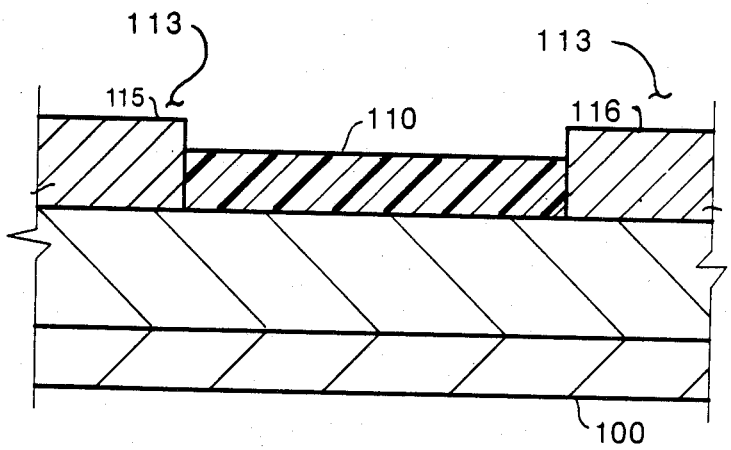
FIG. 2 shows the wafer illustrated in FIG. 1 after contact formation according to the preferred embodiment.
Figure 3:
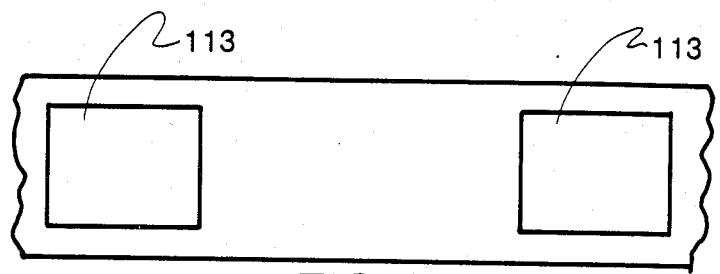
FIG. 3 shows a top view of the structure illustrated in FIG. 2.

As shown in FIG. 2, portions of dielectric layer 110 are removed over regions 113 and ohmic contacts 115 and 116 for the drain and source electrodes are formed in regions 113 by standard techniques. For example, a layer of photoresist (not shown) is applied over the GaAs wafer. Openings in the photoresist layer which correspond to the drain and source areas are formed in the photoresist, and various layers of the appropriate metals are succesively deposited in the openings. The photoresist and excess metal are removed from the region surrounding the drain and source openings, and finally the metal layers are heated until they alloy with each other and the GaAs surface. FIG. 3 shows a top view of the structure illustrated in FIG. 2 after ohmic contacts 115 and 116 are formed in regions 113.

Figure 4:
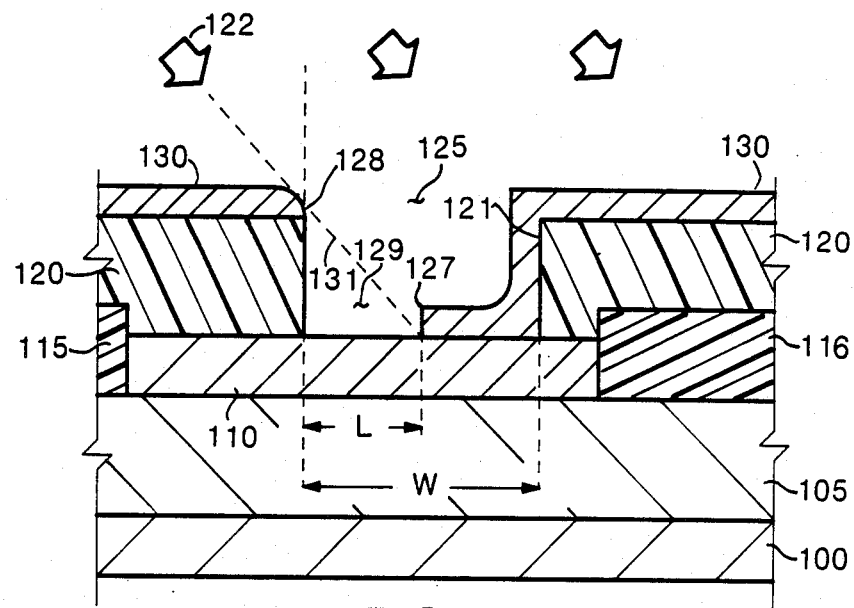
FIG. 4 shows the structure illustrated in FIG. 2 during gate length formation according to the preferred embodiment.

As illustrated in FIG. 4, a photoresist layer 120 is deposited (spun) on ohmic contacts 115 and 116 and dielectric layer 110. By standard optical photolithographic techniques, an area 125 of photoresist layer 120, corresponding to the base area of gate electrode, is selectively removed. The thickness of photoresist layer 120 is in the range of 1 to 1.5 microns. A distance W, across area 125, taken in the plane of FIG. 4, is preferrably in the range of 0.65 to 1 micron.

The structure is then metallized. A metal layer 130, typically made of aluminum having a thickness in the range of 1000 to 1500 Angstroms, is deposited by angle evaporation techniques on photoresist layer 120, sidewall 121 of photoresist layer 120, and dielectric layer 110; however, thicknesses as low as 500 Angstroms can be used. During the aluminum metal deposition GaAs wafer 100 is tilted at an angle in the range of 10 to 14 degrees off the plane normal to the incident aluminum beam (indicated by arrows 122). The result of having the aluminum evaporation occur at an angle in the range of 10 to 14 degrees is that the photoresist layer sidewall 128 shadows an area 129 of dielectric layer 110 from metal deposition and forms an edge 127. Thus, under dashed line 131 in area 129 on dielectric layer 110, no metal is deposited. Here angle evaporation techniques are used to mask the gate electrode area in preparation for gate electrode formation which is in direct contrast to the article discussed in the background of the invention which uses the standard technique of angle evaporation to directly form the gate electrode.

Figure 5:
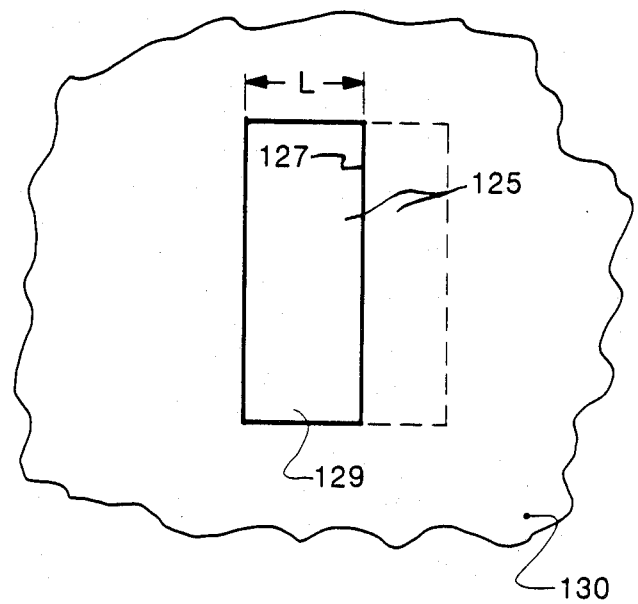
FIG. 5 shows a top view of the structure illustrated in FIG. 4.

A distance L, across area 129, also taken in the plane of FIG. 4, is approximately in the range of 0.25 to 0.30 microns. This distance corresponds to the gate length. It should be understood that the terms gate width and gate length are used in this application with their standard meaning. The term length is taken along the direction of a first hypothetical line running from the drain to the source of the gate electrode, whereas the term gate width is taken along the direction of a hypothetical second line perpendicular to the first line. As mentioned above, it is desirable with microwave FETs to keep the gate length as short as possible while still having a low electrical resistance. FIG. 5 shows a top view of a portion of the structure illustrated in FIG. 4 during gate length formation in area 129.

Figure 6:
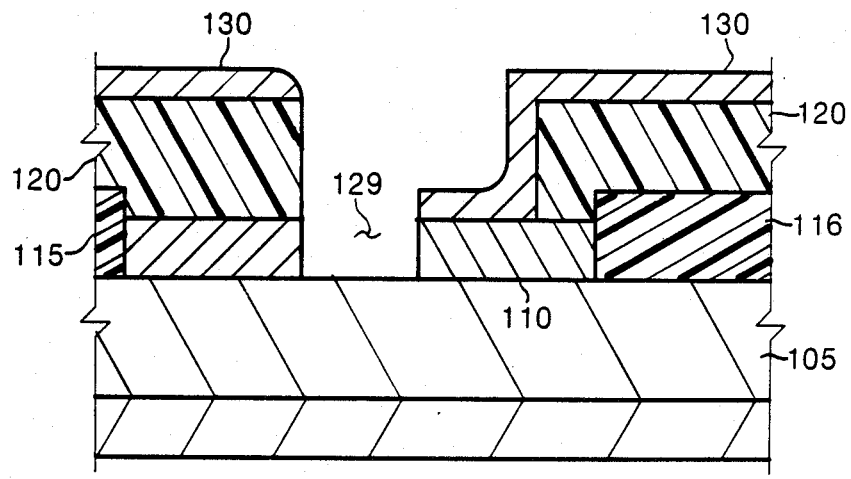
FIG. 6 shows the structure illustrated in FIG. 4 after gate length formation.

As shown in FIG. 6, dielectric layer 110 in gate length area 129 is removed by Reactive Ion Etching techniques in a $CF_4 + O_2$ ambient at 50 watts of input power for 50 to 70 minutes to expose the underlyiing GaAs epitaxial layer 105.

Metal layer 130 and first photoresist layer 120 are removed over ohmic contacts 115 and 116 and dielectric layer 110 by conventional methods, such as etching and chemical lift-off. A second photoresist layer 140 is then deposited (spun) on ohmic contacts 115 and 116 and portions 142 of dielectric layer 110, and the exposed GaAs epitaxial layer in the gate length area 129 is then chemically wet etched to create a trough region 150, as illustrated in FIG. 7.

Figure 7:
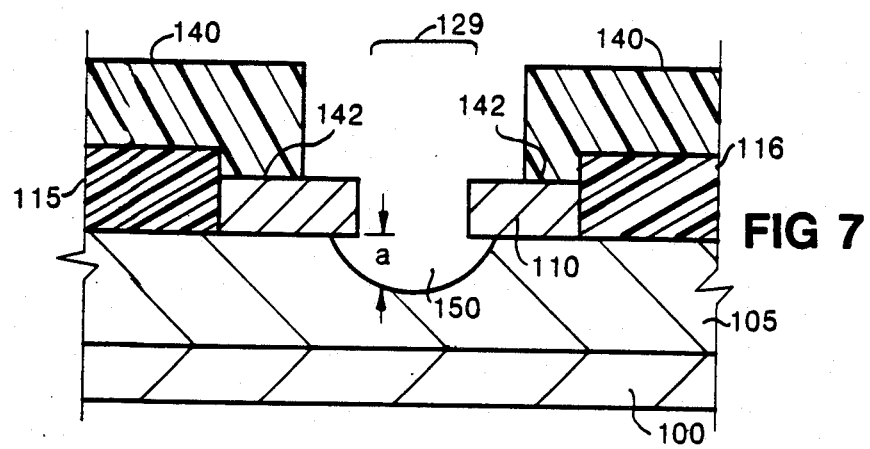
FIG. 7 shows the structure illustrated in FIG. 6 after etching of the gate length area.
Figure 8:
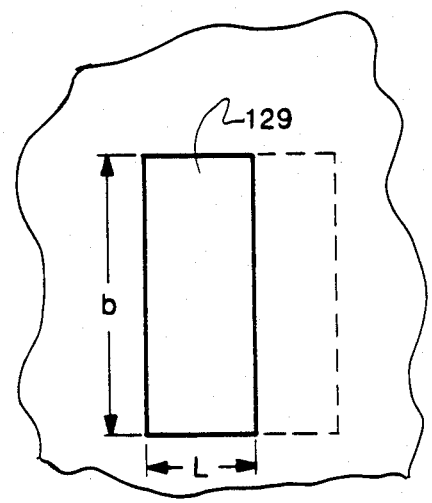
FIG. 8 shows a top view of the structure illustrated in FIG. 7.

FIG. 8 shows a top view of the gate length area shown in FIG. 7. A width b and depth a, shown in FIG.

7, are determined by source-drain current measurements. The source-drain current measurements are obtained by first measuring the current between the source and drain areas at the ohmic contacts 115 and 116, respectively before wet etching. Wet etching is started and then stopped after 30 to 40 seconds, the current is again measured between the source and drain areas. If the source-drain current measurement taken after etching falls within predetermined current specifications, no further etching is required. However, if the measurement does not fall within the current specifications, the measurement taken prior to wet etching and the measurement taken after etching are used to calculate the etch rate and subsequently the time required for additional etching. Typically, current specifications within the range of 30 to 45 milliamps per 100 micrometer gate width are common. Approximately 1500 Angstroms of epitaxial layer 105 is removed in trough region 150 after the etch.

Figure 9:
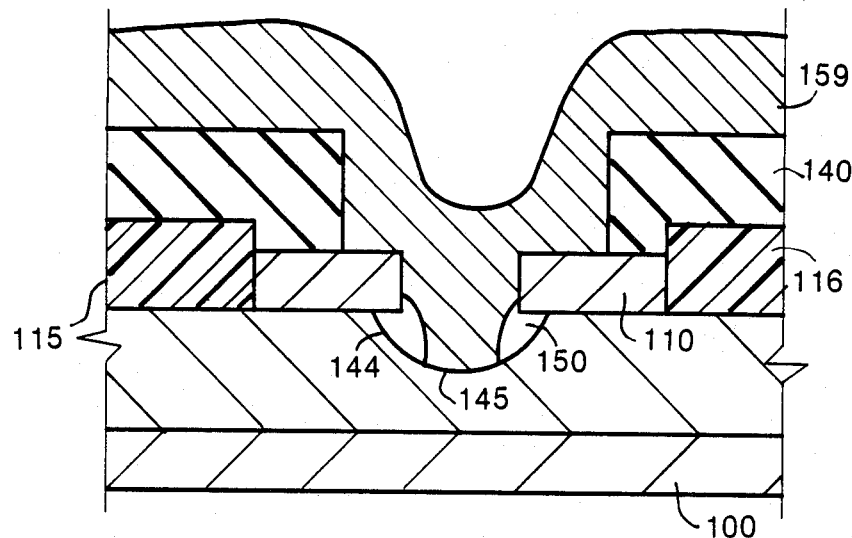
FIG. 9 shows the structure illustrated in FIG. 7 during gate metallization

As illustrated in FIG. 9, photoresist layer 140, dielectric layer 110, and a surface portion 145 of GaAs epitaxial layer 105 surface 144 in trough region 150 are metallized. A metal layer 159, which is actually successive layers of titanium, platinum and gold, is deposited at a power which prevents heat induced deformation of the photoresist layer 140, and in the case of sputter deposition which decreases radiational damage to the GaAs surface 144 at the gate electrode. Thicknesses of the titanium, platinum and gold are typically 2000, 1500 and 6000 Angstroms respectively. The deposition may, for example, be done by evaporation techniques in which the metal is evaporated with a focused electron beam in a vacuum deposition system. Suitable equipment for carrying out this operation is performed in a Model BJD-1800 deposition system manufactured by Airco Temescal. It will be understood by those skilled in the art that other suitable equipment may be utilized to carry out the same deposition, provided it is done at a power which prevents heat induced deformation of the photoresist layer 140.

While a particularily advantageous alloy has been given by way of example for metal layer 159, it will be apparent to those skilled in the art that numerous other suitable metals can be used, such as, for example, tungsten, molybdenum, palladium, aluminum, chromium, and hafnium and some alloys of these metals.

Figure 10:
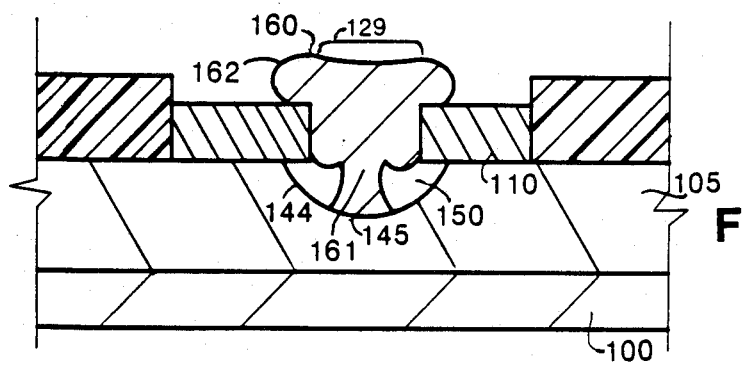
FIG. 10 shows the structure illustrated in FIG. 9 after gate formation.

After the portion of metal layer 159 over photoresist layer 140 along with photoresist layer 140 are removed, e.g., by chemical lift-off techniques, a completed gate electrode 160 remains, as shown in FIG. 10.

Gate electrode 160 extends through the opening in dielectric layer 110 in area 129. The cross-sectional configuration of gate electrode 160, taken in a plane which is perpendicular to the planar surface of the wafer, has a "T" shape. It has a relatively narrow stem portion 161 which contacts the GaAs epitaxial surface portion 145 and a larger or extended shoulder portion 162 which overhangs the sides of the stem portion above the opening in dielectric layer 110 in area 129.

Figure 11:
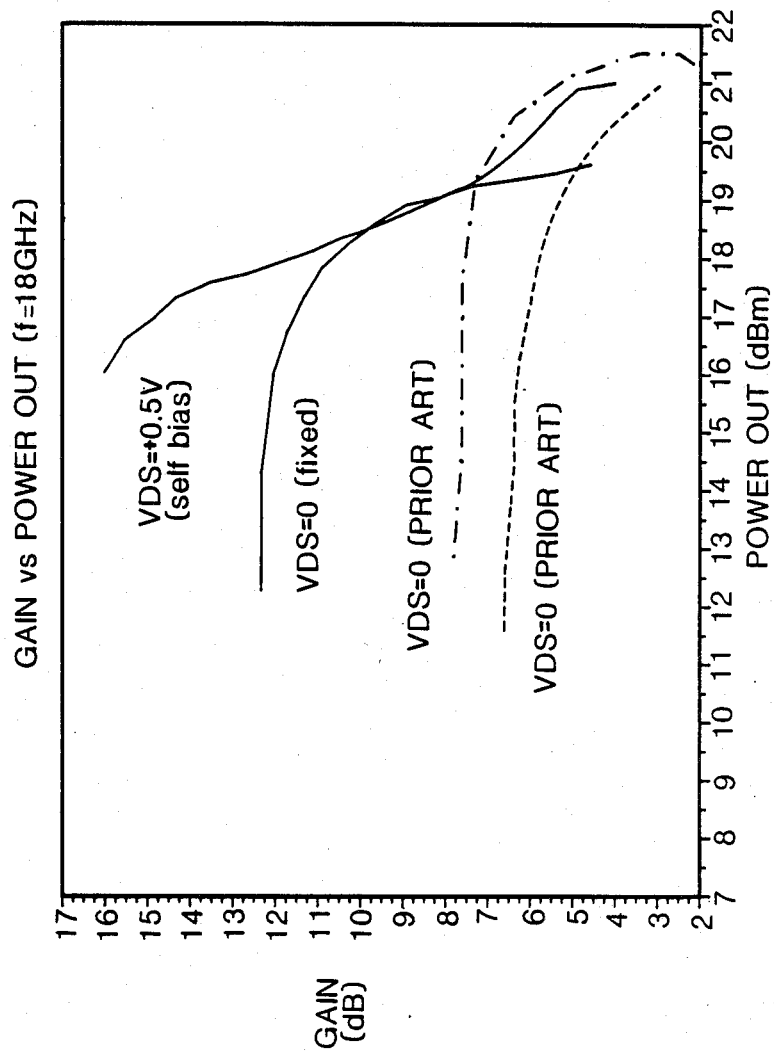
FIG. 11 shows the gain-power characteristics of a GaAs MESFET device fabricated according to the preferred embodiment.

One of the advantages of this embodiment of the invention is that the sensitive gate region 125 (see FIG. 4) and gate trough region 150 are protected from contamination during gate formation. The contamination introduced during subsequent processing after gate trough and gate electrode formation is dramatically reduced by the pre-passivation of the area between the ohmic contacts prior to gate electrode formation with dielectric layer 110, resulting in significant improvements in the transconductance for forward bias gate voltage. Values of the transconductance as high as 250 millisiemens per millimeter are measured for devices fabricated in accordance with the preferred embodiment in which the gate area is pre-passivated prior to gate electrode fabrication as compared to 160 millisiemens per millimeter for prior art devices in which a pre-passivation layer was formed after the gate electrode was fabricated. FIG. 11 shows the gain-power characteristics of a MESFET device fabricated with the preferred embodiment, and used in the common source configuration. In various device applications, such as, amplifiers and oscillators, it is desirable that the device have the highest possible gain for any given output power level. As shown in FIG. 11, a 40 decibel increase in the gain for a given output power is obtained on devices using the pre-passivation layer prior to gate formation as compared to the prior art. An additional advantage includes a reduction of the electrical gate resistivity by a factor of 2 to 3. A gate resistivity of less than 6 ohm per micrometer gate width is typical.

Illustrated in FIGS. 12-16 is an alternative embodiment of the method of the invention. Elements which correspond to the embodiment depicted in FIGS. 1-10 have been given corresponding reference numerals. The modification of this embodiment over that described in reference to FIGS. 1-10 is basically that the base area of the gate electrode 125 is defined using two photoresist layers separated by a thin metal layer.

Figure 12:
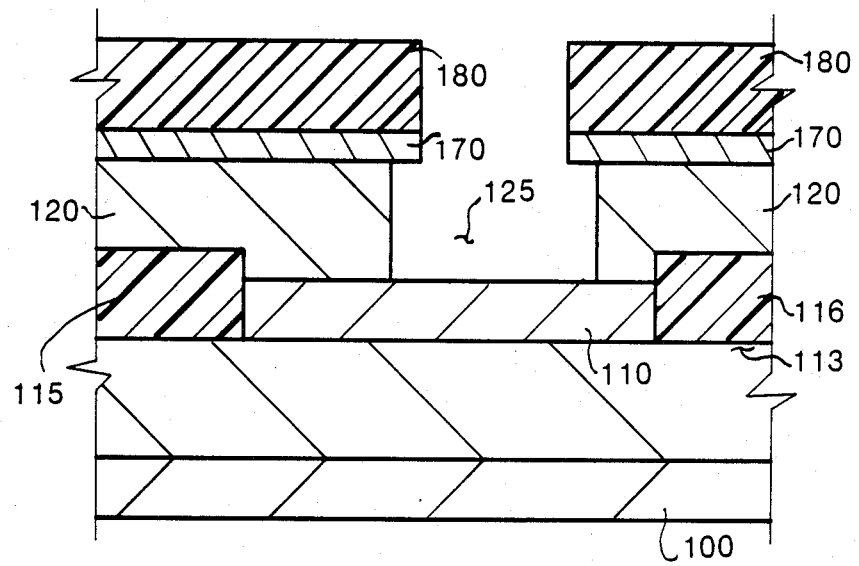
FIG. 12 shows a cross-sectional view of an alternative embodiment of the pre-passivated GaAs wafer illustrated in FIG. 1 after ohmic contact formation and during gate length formation.

As shown in FIG. 12, a dielectric (pre-passivation) layer 110 is formed as described above. The dielectric layer 110 also serves as a pre-passivation layer which protects the gate electrode area from contamination and subsequent processing variations, as described above. Ohmic contacts 115 and 116 for the drain and source electrodes are also formed as described above. A photoresist layer 120 is deposited (spun) on the ohmic contacts 115 and 116 and dielectric layer 110. A metal layer 170, typically made of aluminum having a thickness in the range of 50 to 100 Angstroms is deposited over the photoresist layer 120 by conventional methods, such as sputtering or evaporation. A photoresist layer 180 is deposited (spun) over the metal layer 170. The base area 125 of the gate electrode is formed by removing first photoresist layer 120, metal layer 170 and second photoresist layer 180 in region 125 by conventional methods.

Figure 13:
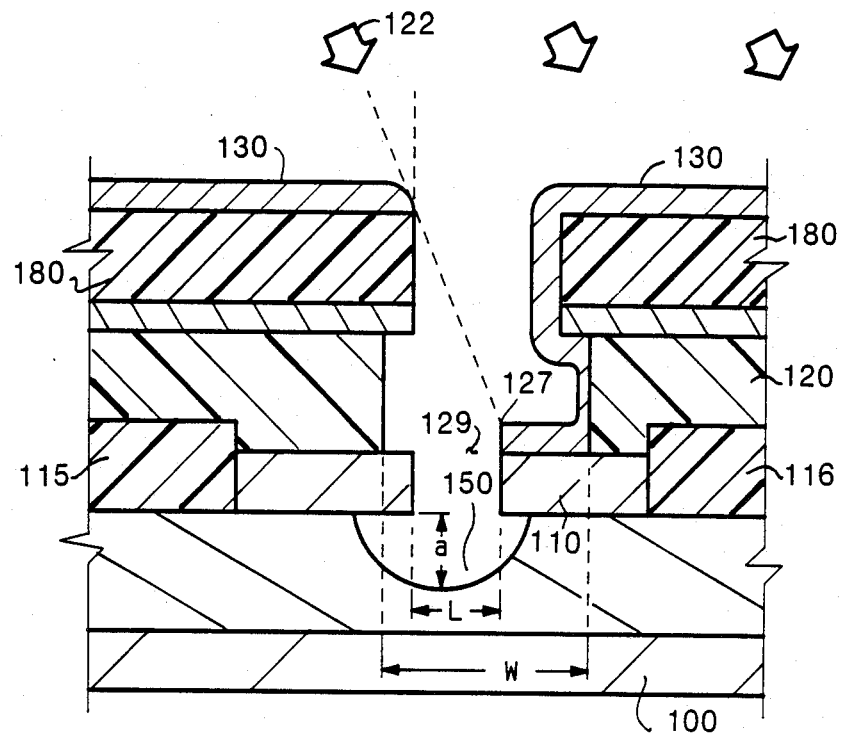
FIG. 13 shows the structure illustrated in FIG. 12 after gate length formation and etching of the gate length area.
Figure 15:
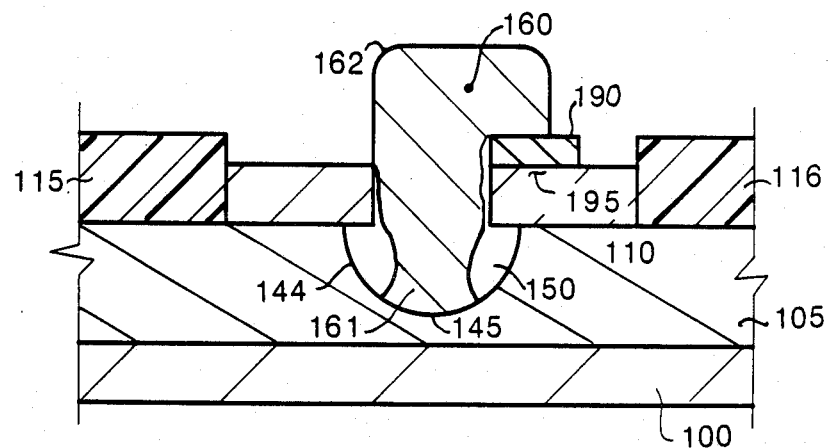
FIG. 15 shows the structure illustrated in FIG. 14 during gate formation.

As further illustrated in FIG. 13, a metal layer 130, typically made of aluminum having a thickness in the range of 2000 to 3000 microns, is deposited on photoresist layer 180 and dielectric layer 110 by angle evaporation techniques. The deposition of metal layer 130 is done in the same manner as was described in reference to the embodiment of FIG. 4. The dielectric layer 110 in gate length area 129 is removed by Reactive Ion Etching techniques to expose the underlying GaAs epitaxial layer 105. The exposed GaAs epitaxial layer 105 in the gate length area 129 is chemically wet etched to create a trough region 150. The depth a of trough region 150 is determined by similar source-drain current measurements described above.

Figure 14:
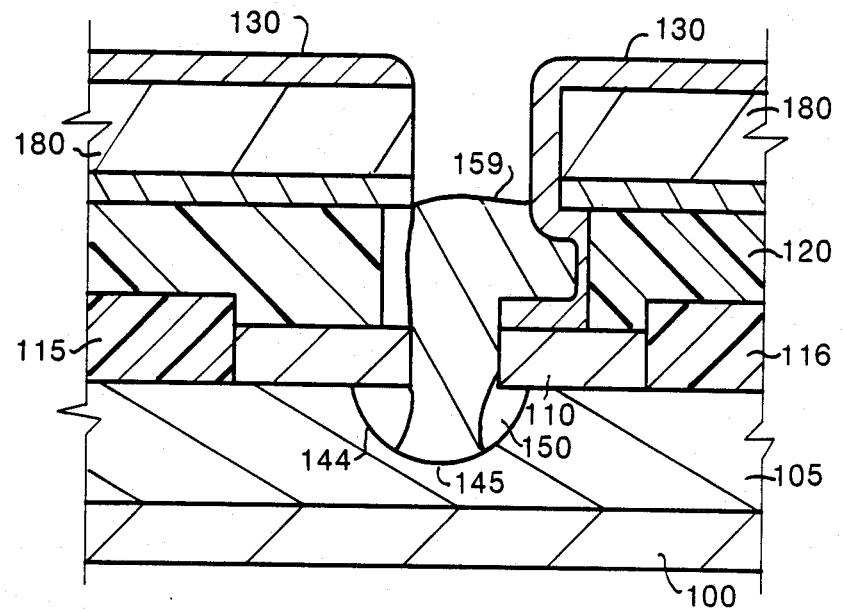
FIG. 14 shows the structure illustrated in FIG. 13 after gate metallization according to the invention.
Figure 16:
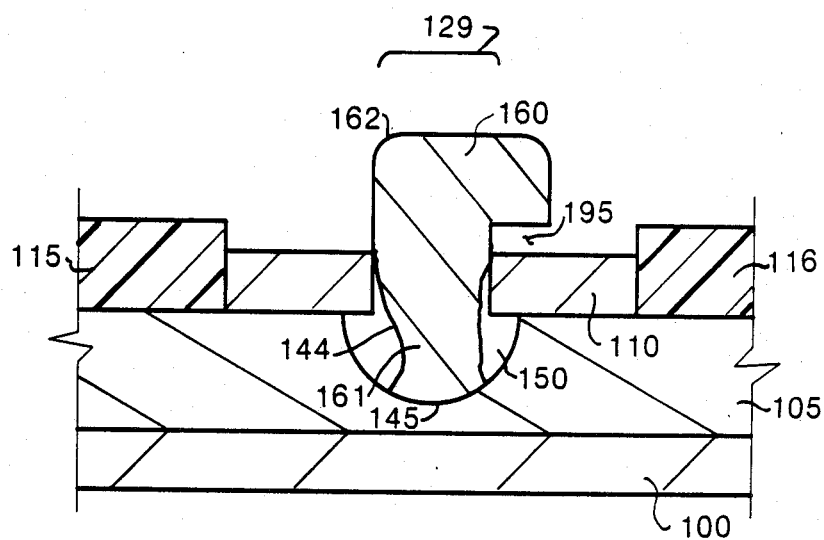
FIG. 16 shows the structure illustrated in FIG. 15 after gate formation.

In FIG. 14, a metal layer 159, which is successive layers of titanium-platinum and gold, similar to that illustrated in FIG. 9, is deposited over a surface portion 145 of GaAs epitaxial layer 105 surface 144 in trough region 150 in a similar manner as described above. As further illustrated in FIG. 15, the metal layer 159, photoresist layer 180, metal layer 170, and photoresist layer 120 are removed by chemical lift-off techniques. A portion 190 of metal layer 130 remains over a portion of dielectric layer 110 in region 195. As shown in FIG. 16, the portion 190 of metal layer 130 is removed over region 195 by conventional methods, such as wet etching, leaving a complete gate electrode 160.

The gate electrode 160 extends through the opening in dielectric layer 110 in area 129. The cross-sectional configuration of the gate electrode 160, taken in a plane which is perpendicular to the planar surface of the GaAs wafer 100, has an inverted "L" shape. It has a relatively narrow stem portion 161 which contacts the GaAs epitaxial layer 105 portion 145 and a larger or extending shoulder portion 162 on one side which overhangs the side of the stem portion through the opening in the dielectric layer 110 in area 129 over region 195. Similar improvements in transconductance, gate resistance and gain as were realized in the preferred embodiment are also obtained with this embodiment.

I claim:

1. A method for producing a device in a semiconductor wafer comprising the steps of:
   forming a dielectric layer over a first region of a surface of the semiconductor wafer;
   forming a first and second contact on second and third regions of the wafer surface, the first and second contacts being separated by the dielectric layer;
   forming a first coating layer over the first and second contacts and the dielectric layer between the contacts, the first coating having an opening over a first region of the dielectric layer, thereby leaving an exposed area of the dielectric layer;
   forming a first metal layer over the first coating layer and a portion of the dielectric layer by angle evaporation;
   removing the dielectric layer in the exposed area, thereby exposing a surface region of the wafer;
   forming a trough region in the exposed surface region of the wafer; and
   depositing a second metal layer on a portion of the wafer in the trough region.

2. A method as in claim 1 wherein the step of forming the trough region in the exposed surface region of the wafer further comprises the steps of:
   removing the first metal layer and first coating layer;
   forming a second coating layer over the first and second contacts and portions of the dielectric layer, the second coating layer having an opening larger than and including the exposed surface region of the wafer over a portion of the first region of the dielectric layer; and
   forming a trough region in the exposed surface region of the wafer between the contacts.

3. A method for producing a device in a semiconductor wafer comprising the steps of:
   forming a semiconductor layer over a surface of the semiconductor wafer;
   forming a dielectric layer over a first region of a surface of the semiconductor layer;
   forming a first and second contact on second and third regions of the semiconductor layer surface, the first and second contacts being separated by the dielectric layer;
   forming a first coating layer over the first and second contacts and the dielectric layer between the contacts, the first coating having an opening over a first region of the dielectric layer surface, thereby leaving an exposed area of the dielectric layer;
   forming a first metal layer over the first coating layer and a portion of the dielectric layer by angle evaporation;
   removing the dielectric layer in the exposed area, thereby exposing the surface region of the semiconductor layer;
   forming a trough region in the exposed surface region of the semiconductor layer; and
   depositing a second metal layer on a portion of the semiconductor layer in the trough region.

4. A method as in claim 3 wherein the step of forming the trough region in the exposed surface region of the semiconductor layer further comprises the steps of:
   removing the first metal layer and first coating layer;
   forming a second coating layer over the first and second contacts and portions of the dielectric layer, the second coating layer having an opening larger than and including the exposed surface region of the wafer over a portion of the first region of the dielectric layer; and
   forming a trough region in the exposed surface region of the semiconductor layer between the contacts.

5. A method as in claim 4 wherein the step of forming a semiconductor layer comprises forming an epitaxial layer.

6. A method for producing a device in a semiconductor wafer comprising the steps of:
   forming a dielectric layer over a first region of a surface of the semiconductor wafer;
   forming a first and second contact on second and third regions of the wafer surface, the first and second contacts being separated by the dielectric layer;
   forming a first coating layer over the first and second contacts and the dielectric layer between the contacts;
   forming a first metal layer over the first coating layer;
   forming a second coating layer over the first metal layer;
   forming an opening through first coating, first metal, and second coating layers over a portion of the dielectric layer, thereby leaving an exposed area of the dielectric layer;
   forming a second metal layer by angle evaporation over the second coating layer and a portion of the dielectric layer;
   removing the dielectric layer in the exposed area, thereby exposing a surface region of the wafer;
   forming a trough region in the exposed surface region of the wafer; and
   depositing a third metal layer on a portion of the wafer in the trough region.

7. A method for producing a device in a semiconductor wafer comprising the steps of:
   forming a semiconductor layer over a surface of the semiconductor wafer;
   forming a dielectric layer over a first portion of a surface of the semiconductor layer;
   forming a first and second contact on second and third regions of the semiconductor layer surface, the first and second contacts being separated by the dielectric layer;
   forming a first coating layer over the first and second contacts and the dielectric layer between the contacts;
   forming a first metal layer over the first coating layer;

forming a second coating layer over the first metal layer;

forming an opening through the first coating, first metal and second coating layers over a portion of the dielectric layer, thereby leaving an exposed area of the dielectric layer;

forming a second metal layer by angle evaporation over the second coating layer and a portion of the dielectric layer;

removing the dielectric layer in the exposed area, thereby exposing a surface region of the semiconductor layer;

forming a trough region in the exposed surface region of the semiconductor layer; and depositing a third metal layer on a portion of the semiconductor layer in the trough region.

8. A method as in claim 7 wherein the step of forming a semiconductor layer comprises forming an epitaxial layer.

* * * * *